United States Patent [19]
Bonora et al.

[11] Patent Number: 5,570,990
[45] Date of Patent: Nov. 5, 1996

[54] HUMAN GUIDED MOBILE LOADER STOCKER

[75] Inventors: Anthony C. Bonora, Menlo Park; Bruce A. Richardson, Pleasanton; Michael D. Brain; Edward J. Cortez, both of San Jose; Barney H. Huang, Sunnyvale, all of Calif.

[73] Assignee: ASYST Technologies, Inc., Fremont, Calif.

[21] Appl. No.: 147,372

[22] Filed: Nov. 5, 1993

[51] Int. Cl.$^6$ ................................ G06F 15/50
[52] U.S. Cl. .................... 414/543; 414/940; 414/626; 414/663; 414/744.2; 414/618; 414/673; 901/1; 901/15; 901/48; 269/17
[58] Field of Search .................... 269/17; 414/539, 414/540, 541, 542, 543, 602, 618, 626, 619, 633, 632, 631, 662, 663, 672, 673, 744.4, 744.5, 744.2, 744.3, 744.1, 744.8, 940; 901/15, 28, 33, 48, 46, 1

[56] References Cited

U.S. PATENT DOCUMENTS

| 3,262,593 | 2/1966 | Hainer | 414/619 |
|---|---|---|---|
| 3,952,880 | 4/1976 | Hill et al. | 901/48 X |
| 4,229,136 | 10/1980 | Panissidi | 414/673 |
| 4,300,198 | 11/1981 | Davini | 901/48 X |
| 4,588,346 | 5/1986 | Smith | 414/673 |
| 4,698,775 | 10/1987 | Koch et al. | 414/940 X |
| 4,705,447 | 10/1987 | Smith | 414/590 |
| 4,850,782 | 7/1989 | Focke | 414/673 X |
| 4,974,166 | 11/1990 | Maney et al. | |
| 4,978,274 | 12/1990 | deGroot | 414/744.5 X |
| 5,097,421 | 3/1992 | Maney et al. | |
| 5,158,417 | 10/1992 | Siegenthaler et al. | 414/543 X |
| 5,160,238 | 11/1992 | Kambara | 414/663 |
| 5,163,802 | 11/1992 | Poinelli | 414/940 X |
| 5,166,884 | 11/1992 | Maney et al. | |

FOREIGN PATENT DOCUMENTS 58-40627  3/1983  Japan.

OTHER PUBLICATIONS

Translation of Japanese Patent Application 58–40627, as translated by Benemann Translation Center.

Primary Examiner—Frank E. Werner
Attorney, Agent, or Firm—Fliesler, Dubb, Meyer & Lovejoy

[57] ABSTRACT

A human guided mobile loader stocker developed to mechanically assist in SMIF container movement. The assist includes a pushcart, a semi-motorized transport arm, a processor, and communication devices. A group of containers are placed on the cart using the arm. The cart is pushed to a semiconductor processing tool where the arm is used to transfer containers to and from the port of the processing tool. The processor and communication devices are used for inventory control and guiding the container to the port of the processing tool.

21 Claims, 16 Drawing Sheets

# HUMAN GUIDED MOBILE LOADER STOCKER

CROSS-REFERENCE TO RELATED APPLICATIONS/PATENTS

This Application is related to the following Applications/Patents, all assigned to the assignee of the subject Application:

SEALED STANDARD INTERFACE APPARATUS, U.S. Pat. No. 4,674,939;

INTELLIGENT WAFER CARRIER, U.S. Pat. No. 5,097,421;

PROCESSING SYSTEMS WITH INTELLIGENT ARTICLE TRACKING, U.S. Pat. No. 4,974,166;

INTELLIGENT SYSTEM FOR PROCESSING AND STORING ARTICLES, U.S. Pat. No. 5,166,884; and SEALABLE TRANSPORTABLE CONTAINER HAVING IMPROVED LATCH MECHANISM, U.S. Pat. No. 4,995,430.

Each of these Applications/Patents is incorporated herein by reference.

BACKGROUND OF THE INVENTION

1. Field of the Invention

The present invention relates to a human guided mobile loader and stocker, primarily used to load, unload, and transport containers in a standard mechanical interface system.

2. Description of the Related Art

A standardized mechanical interface (SMIF) system proposed by the Hewlett-Packard Company is disclosed in U.S. Pat. Nos. 4,532,970 and 4,534,389. The purpose of a SMIF system is to reduce particle fluxes onto wafers and/or reticles. This purpose is accomplished, in part, by mechanically ensuring that during transportation and storage the gaseous media (such as air or nitrogen) surrounding the wafers is essentially stationary relative to the wafers and by ensuring that particles from the ambient environment do not enter the immediate wafer environment.

The SMIF concept is based on the use of a small volume of controlled (with respect to motion, gas flow direction and external contaminants), particle-free gas (or vacuum) to provide a clean environment for articles. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 μm to above 200 μm. Particles with these sizes can be very damaging in semiconductor processing because of the small geometries employed in fabricating semiconductor devices. Typical advanced semiconductor processes today employ geometries which are one half micron and under. Unwanted contamination particles which have geometries measuring greater than 0.01 μm substantially interfere with 1 μm geometry semiconductor devices. The trend, of course, is to have smaller and smaller semiconductor processing geometries which today in research and development labs approach 0.2 μm and below. In the future, geometries will become smaller and smaller and hence smaller and smaller contamination particles become of interest.

A SMIF system has three main components: (1) sealed pods (or containers), having a minimal volume, used for storing and transporting cassettes holding reticles or wafers; (2) enclosures placed over cassette ports and wafer processing areas of processing equipment so that the environments inside the pods and enclosures (after having clean air sources) become miniature clean spaces; and (3) a transfer mechanism to load/unload wafer cassettes from a sealed pod without contamination of the wafers in the wafer cassette frown external environments.

Wafers are stored and transported in pods, and are transferred from a pod to processing equipment in the following manner. First, a pod is placed at the interface port at a processing tool. Each pod includes a box and a box door designed to mate with doors on the interface ports of the processing equipment enclosures. Then, latches release the box door and the box door and the interface port door are opened simultaneously so that particles which nay have been on the external door surfaces are trapped ("sandwiched") between the box and interface port doors. A mechanical elevator lowers or translates the two doors, with the cassette riding on top, into the enclosure covered space. The cassette is transferred by gravity or a manipulator and placed onto the cassette platform of the equipment. After processing, the reverse operation takes place.

The SMIF system has proven effective, both inside and outside a clean room, through use in semiconductor fabrication facilities and experiments. A SMIF system provides at least a ten-fold improvement over the conventional handling of open cassettes inside the clean room. Thus, the SMIF system has increased the efficiency of semiconductor fabrication facilities.

The next step to increase the efficiency of semiconductor fabrication facilities includes improving the ergonomics associated with material handling in a clean room semiconductor fabrication facility. For example, clean room operators (employees working in a clean room or other semiconductor fabrication facility) are often required to lift weights of up to 14 pounds to a maximum port plate height of 63 inches. Such lifting and maneuvering causes fatigue and places physical strain on tendons, nerves, and other sensitive connective tissue in the shoulder area and may cause carpal tunnel degradation to clean room operators. The working heights are typically above shoulder level for a significant percentage of the population. Working at or near shoulder level forces relatively small muscles to perform the lifting task, as well as adversely impacting neurovascular tissue in the shoulder area. Increased strain is also placed on the muscles in the low back region when working above shoulder level.

An increase in efficiency of clean room operators could lower manufacturing costs. For example, current SMIF systems, due to size and weight of SMIF pods, allow a clean room operator to transport one SMIF pod at a time. Furthermore, when an operator brings a first SMIF pod to a processing station, there may be a second SMIF pod at that station. The operator is then forced to find a place to store the first SMIF pod while the operator is removing the second SMIF pod from the processing tool. Then, the operator must find a place to store the second SMIF pod while the operator is placing the first SMIF pod on the tool. Sometimes an operator is forced to temporarily place a SMIF pod on the floor or other unsuitable surface.

Additionally, because of the height of a port, accurate placement of the pod on the port may sometimes be difficult for an operator who is shorter than the port.

Any solution to the above-mentioned problems should include some means for preventing an operator from bringing the wrong SMIF pod to the wrong processing tool and must include a means for preventing the operator from damaging the SMIF pods or the contents of the pods.

SUMMARY OF THE INVENTION

The present invention is directed to overcome the disadvantages of the prior art.

It is, therefore, an object of the present invention to provide a human guided mobile loader stocker which will assist a clean room operator in loading a SMIF pod onto a port and unloading a SMIF pod from a port in order to reduce carpal tunnel degradation and fatigue of clean room operators.

Another object of the invention is to provide an efficient means for clean room operators to handle more than one SMIF pod at a time.

Another object of the present invention is to provide a mobile loader stocker with a mechanical assist for pod movement, including a positioning system for assisting the clean room operator in positioning the SMIF pod at the proper location on the SMIF port.

Another object of the present invention is to provide for a mobile loader stocker for mechanically assisting SMIF pod movement that includes a means for reducing probability of a clean room operator placing the wrong SMIF pod on the wrong SMIF port.

These and other objects of the present invention are provided by a human guided mobile loader stocker system for handling objects, such as SMIF pods. In one embodiment, the system includes a base and a shaft having a longitudinal axis. The shaft is supported by the base and can be raised and lowered along the longitudinal axis. The system includes a first arm and a first joint connecting the first arm to the shaft so that the first arm can rotate about the longitudinal axis. The system further includes a second arm and a second joint for connecting the second arm to the first arm. The system includes a hand for engaging the object and means for connecting the hand to the arm. A clean room operator can manipulate the position of the hand by raising, lowering, or laterally moving the hand.

In one alternative, the hand could be a fork or U-shaped structure. The shaft could be motorized so that it can be raised and lowered at the push of a button. The motor, powered by a battery which includes a circuit for conserving the power of the battery, is connected to a gear box and clutch system which, provide for raising and lowering the shaft, which raises and lowers the hand. The motorized lift removes the task of heavy lifting for the clean room operator; therefore, reducing the risk of fatigue and carpal tunnel degradation.

In another embodiment, the mobile loader stocker could include a processor and a memory device connected to the processor. The processor will communicate through infrared communication means with the processing station. Using a display on the mobile loader stocker system, the processor can alert the clean room operator whether a specific SMIF pod should be placed on that processing station.

In another embodiment, the system includes a guide that helps the clean room operator position the SMIF pod to the proper location on a SMIF port. The guide could be mechanical or electronic.

DESCRIPTION OF THE PREFERRED EMBODIMENT

The present invention will be described in the context of a system for storing and transporting wafers and/or reticles. However, it is to be understood that a loader stocker in accordance with the present invention may be used to store and transport many other objects. The use of the present invention with SMIF systems is only one of many possible applications.

Figure 1A:
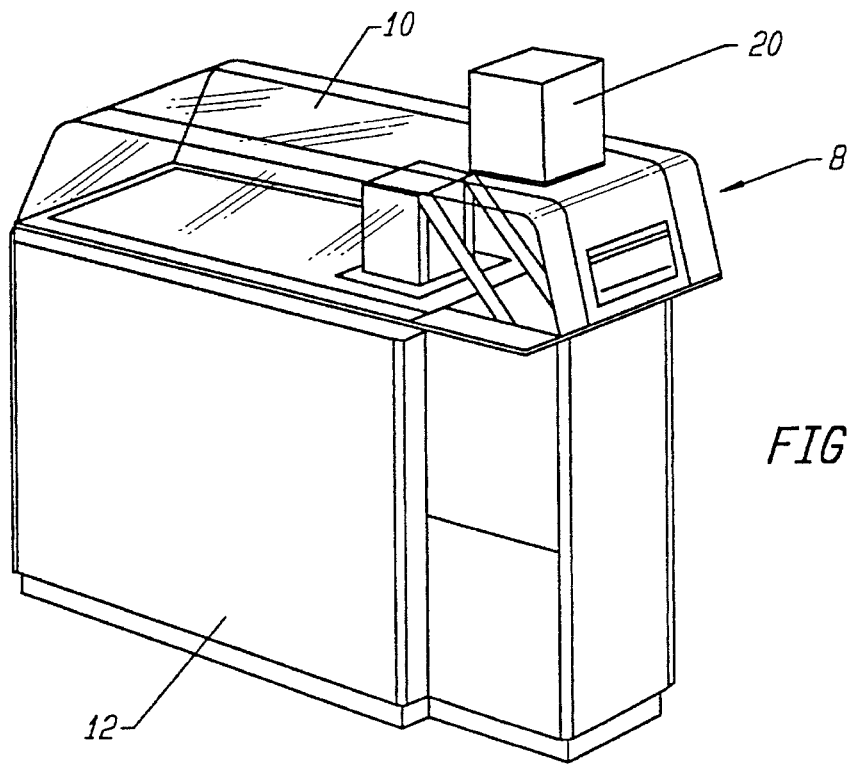
FIG. 1A is an isometric view of a processing station having a canopy for receiving a SMIF pod.
Figure 1B:
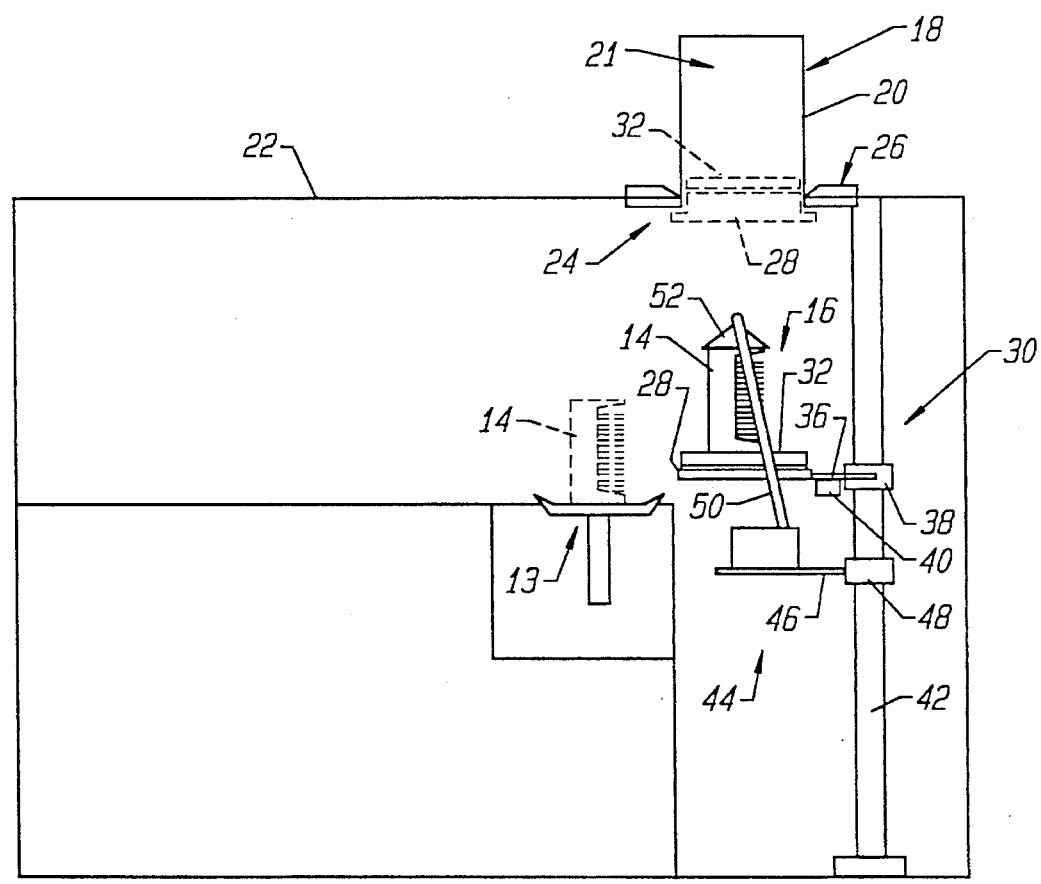
FIG. 1B is a cutaway side view of the processing station of FIG. 1A.

One example of a SMIF system is shown in FIGS. 1A and 1B, which illustrate a processing station 8 having a canopy 10 which is an easily removable shield that covers the wafer handling mechanism of processing equipment 12. Equipment 12 may be, for example, a photoresist applicator, mask aligner, inspection station or any similar processing equipment. Canopy 10, which is constructed of transparent plastic such as acrylic or lexan to facilitate visual inspection and/or maintenance within canopy 10, encloses the handling mechanism for processing equipment 12 and a holder 14, such as a wafer cassette holding wafers 16. The environment within the processing equipment is separately maintained and separately cleaned; therefore, equipment 12 need not be installed in a clean room.

A sealable transportable container (or pod) 18 including a box 20 having interior region 21 and a box door 32 is mounted on a planar surface 22 of a canopy 10 of a port assembly 24. The surface 22 could be up to six feet or more off the ground. Port assembly 24 includes a port plate 26, port door 28, and an elevator assembly 30. Elevator assembly 30 transports a cassette 14 containing integrated circuit wafers 16 from interior region 21 of a box 20 into the region beneath canopy 10.

In FIG. 1B, port door 28 and box door 32 are shown in the closed position by the dotted lines. The elevator assembly 30 includes a platform 36, a shaft engagement device 38 and a drive motor 40. Platform 36 carries port door 28, box door 32 and cassette 14 in a vertical direction. Platform 36 is attached by engagement devices 38 to a vertical guide 42 of elevator assembly 30.

Typically, guide 42 includes a lead screw (not shown) and drive motor 40 drives a gear (not shown) which engages the lead screw for driving platform 36 up or down. When platform 36 is driven to the closed position, port door 28 closes the port opening in canopy 10.

In a similar manner, a manipulator assembly shown generally by numeral 44 includes a platform 46 which has an engagement means 48 for engaging vertical guide 42. Manipulator assembly 44 includes a manipulator arm 50 and engagement head 52 adapted to engage cassette 14. By vertical operation of platforms 36 and 46, and by operation of manipulator assembly 44, cassette 14 is moved from its position on box door 32 to a position on equipment station 13 (as shown by the broken lines).

Figure 2:
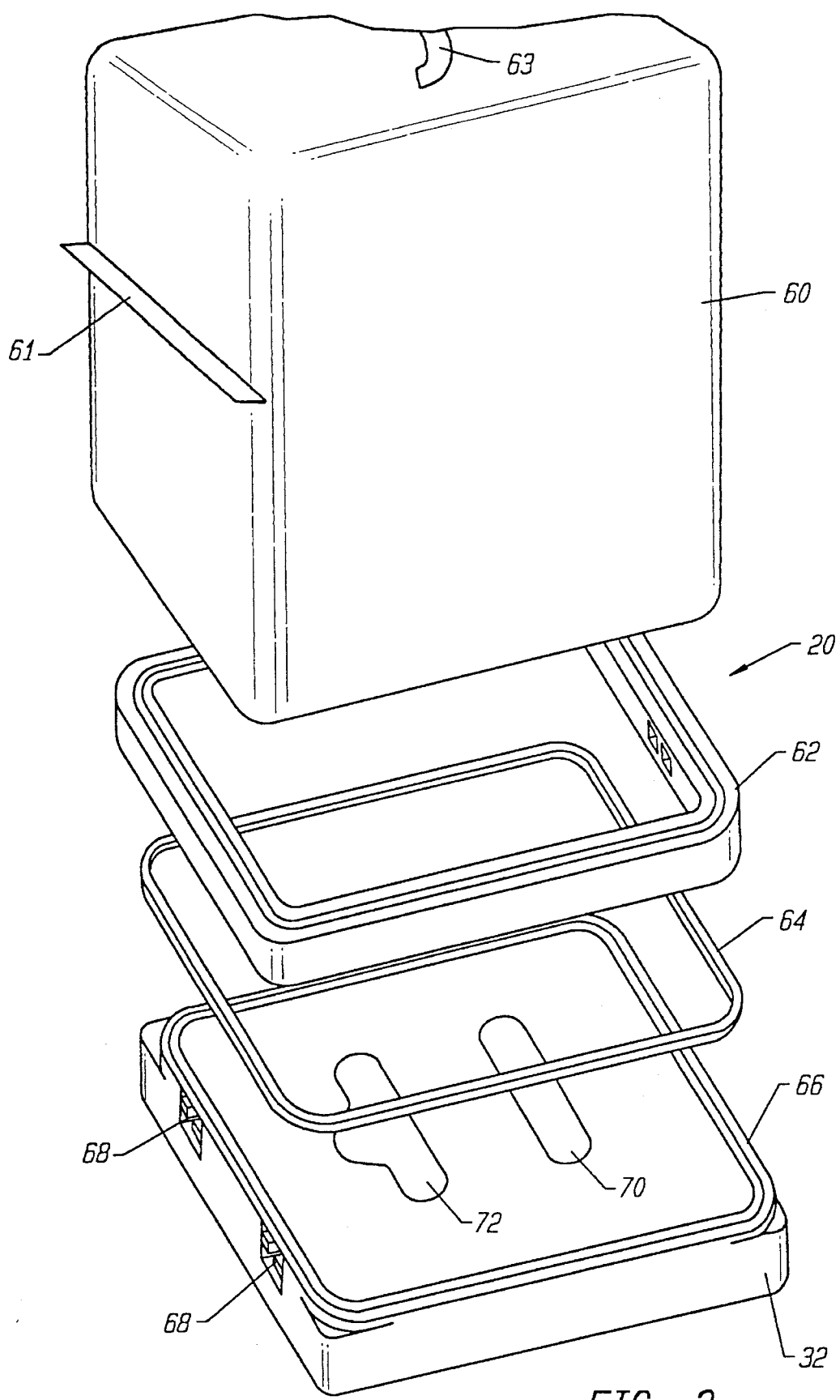
FIG. 2 is an exploded isometric view of a SMIF pod in accordance with the present invention.

With reference to FIG. 2, box 20 includes a domed housing 60 and a ring-like engaging portion 62. Housing 60 and engaging portion 62 may be formed integrally, for example, by injection molding, or as separate components assembled to form box 20. Housing 60 includes side rails 61 and handle 63. A gasket 64, which provides the seal between box 20 and box door 32 resides in a gasket-retaining slot 66 in box door 32. In the preferred embodiment, a liner (not shown) is provided on door 32 and gasket 64 contacts the liner. The liner is a removable element which may be formed of, for example, plastic materials which do not outgas or introduce particles, as described in U.S. Pat. No. 4,739,882, which is hereby incorporated by reference. The liner may also be formed of a material which provides the capability of dissipating or preventing the formation of static charges, for example, stainless steel or conductive plastic. A latch mechanism is housed in box door 32 and protrudes from box door 32 through windows 68 to engage box 20. On the top surface of box door 32 are cassette guides 70 and 72, which are used to position cassette 14 on box door 32.

Figure 3:
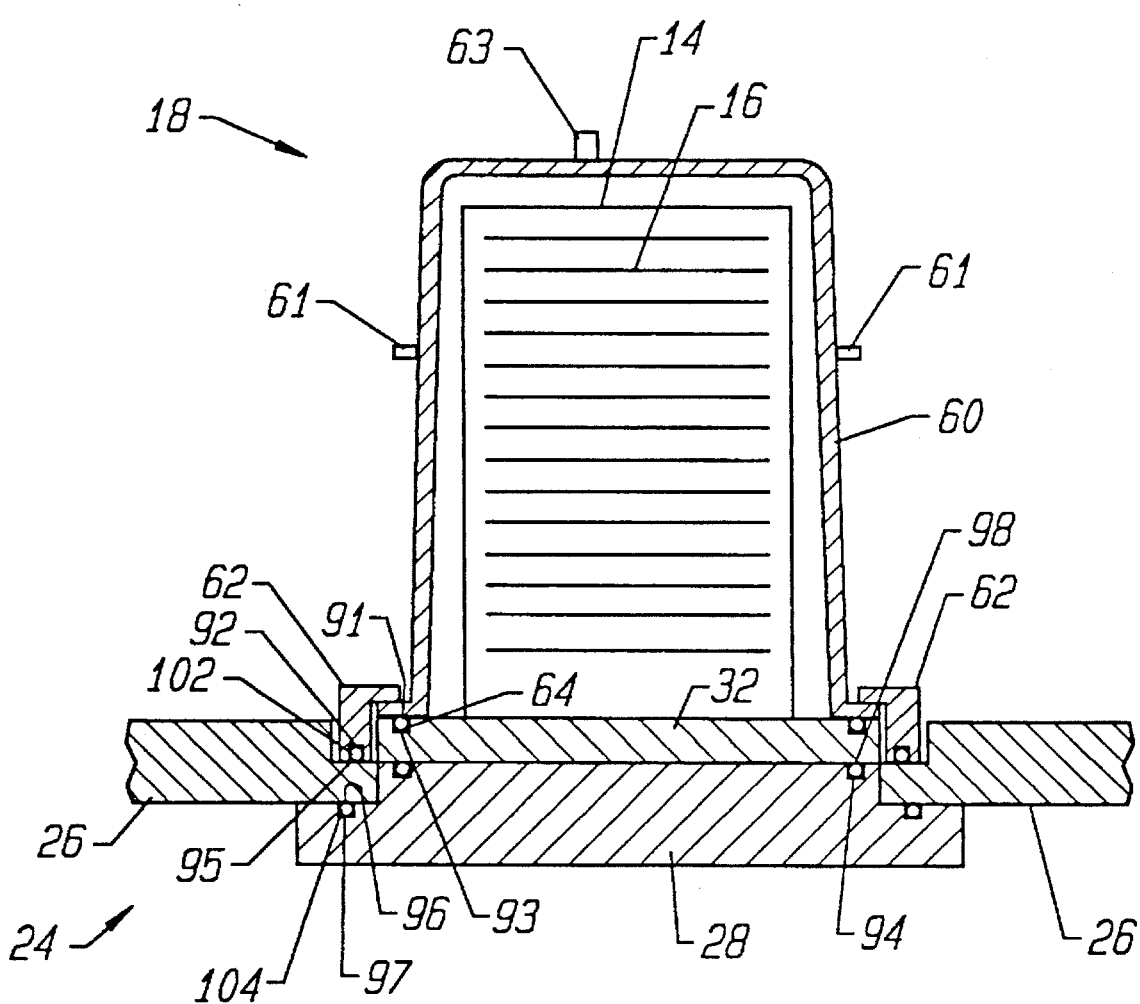
FIG. 3 is a sectional view of a SMIF pod and a port assembly for receiving the SMIF pod.

FIG. 3 shows container 18 mated to port assembly 24 of processing equipment 12. Container 18 is designed for sealably mating with the port assembly 24. Box 20 has first and second box top sealing surfaces 91 and 92, respectively. Box door 32 has a first box door sealing surface 93 for sealably mating with first box top sealing surface 91 and, gasket 64 between surfaces 91 and 93 provides a first seal. Port plate 26 has first and second port plate sealing surfaces 95 and 96, respectively. First port plate sealing surface 95 sealably mates with second box top sealing surface 92, forming second seal as gasket 102 is compressed.

Port door 28 has a first port door sealing surface 97 which sealably mates with second port plate sealing surface 96 forming a third seal with gasket 104. Port door 28 has a second port door sealing surface 94 which sealably mates with second box door sealing surface 98 to form a fourth seal.

The preceding paragraphs discuss a container 18 with a door 32 on the bottom of container 18, thus, necessitating vertical loading and unloading. The loader stocker (described below) can be used with containers having horizontal loading and unloading. Additionally, the loader stocker of the present invention could be used with various other types of containers (e.g., non-SMIF or unrelated to semiconductor fabrication) or objects, in various manufacturing, storage, or other environments.

Figure 4:
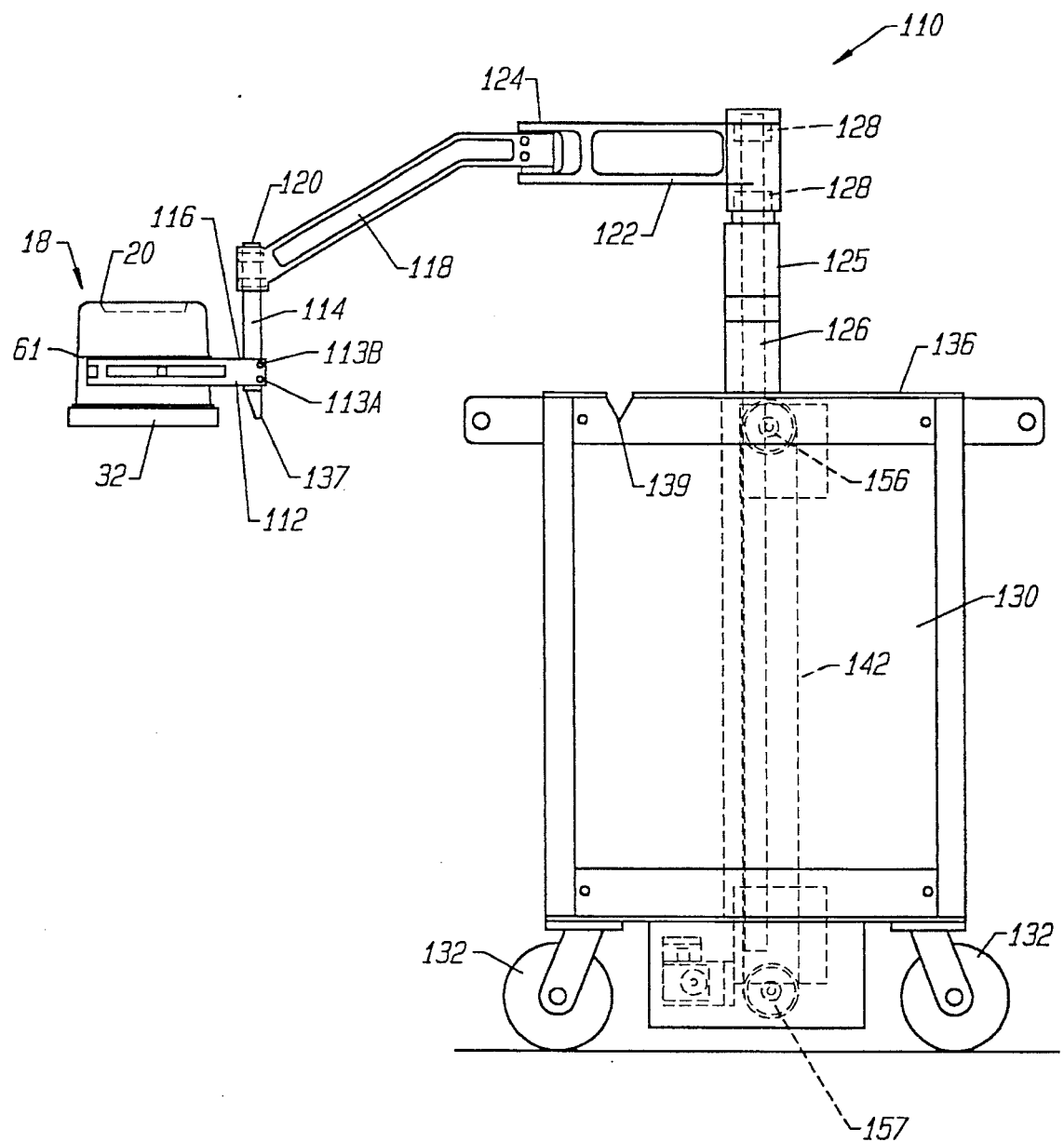
FIG. 4 is a cut away side view of the preferred embodiment of the present invention.

FIG. 4 shows a preferred embodiment human guided mobile loader stocker 110. The mobile loader stocker 110 has a hand 112 for engaging box 20 of container 18. The hand is preferably a fork-shaped or U-shaped apparatus that grabs the box 20 immediately below side rails 61. Hand 112 is rigidly attached to shaft 114 at end 116. Shaft 114 is connected to bent arm 118 by joint 120. Bent arm 118 is connected to straight arm 122 by joint 124. Straight arm 122 is connected to shaft 126 by joint 128. Joints 120, 124, and 128 are pivoting joints, comprising a combination of ball thrust beatings and needle-type radial bearings. Alternative joints include a tapered roller bearing, cylindrical roller bearing, or low friction plastic bearing.

Shaft 126 fits within support tube 125 which is rigidly mounted to cart 130. Upper surface 136 of cart 130 supports container (or other objects) stored on the mobile loader stocker 110. In the preferred embodiment, two or four SMIF containers can fit on surface 136. Cart 130 is supported by wheels 132 which allow the cart 130 to be transported throughout the clean room by an operator.

Joint 124 includes a spring so that when a clean room operator is not exerting a force on hand 112 or arm 118, the spring (not shown) "bends" joint 124, pulling arm 118 toward arm 122 and, hand 112 toward shaft 126. Additionally, joint 120 includes a cam and a spring. When no force is exerted by an operator on hand 112, hand 112 spins until it reaches an orientation where the mouth of U-shaped hand 112 faces shaft 126. Thus, when an operator is not holding hand 112, hand 112 is pulled in towards shaft 126. This feature is a homing feature and is used to prevent accidents; for example, an operator walking into an outstretched hand 112.

Furthermore, shaft 114 includes a cone 137 protruding out the bottom of shaft 114. Cart 130 includes a hole 139 designed so that cone 137 can fit inside hole 139. Before moving cart 130, hand 112 can be moved by a clean room operator such that cone 137 will be placed inside hole 139; therefore, preventing hand 112 from swinging out and causing harm to an operator.

A safety feature to protect the contents of the container includes locking the container to the port. The port will not release the container until the container is engaged by the mobile loader stocker.

In FIG. 4, the shaft 126 is in the lowest position. Raising and lowering shaft 126 raises and lowers hand 112.

Figure 5:
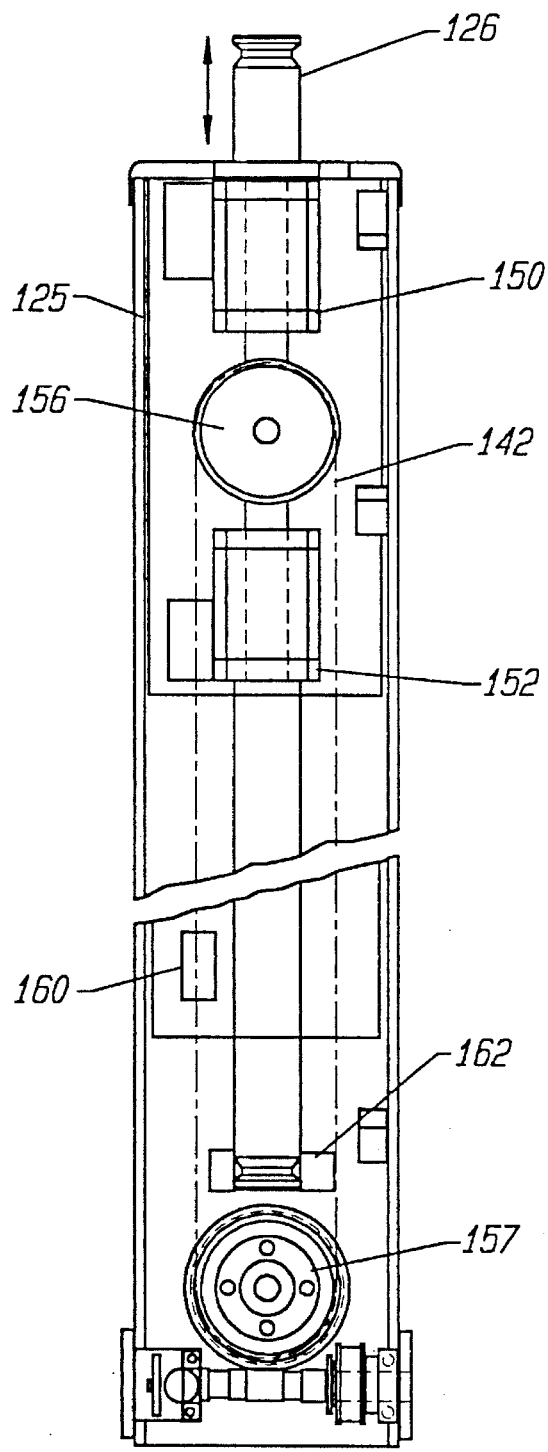
FIG. 5 is a cutaway view of the support tube and the assembly used to lower and raise the shaft of the mobile loader stocker.
Figure 6:
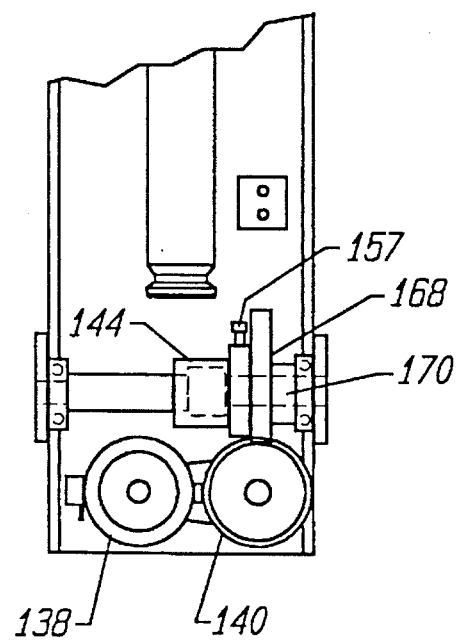
FIG. 6 is a partial close up view of FIG. 5.

Shaft 126 can be lowered and raised using the assembly shown in FIGS. 5 and 6. Linear shaft 126 fits within support tube 125. Two linear travel beatings 150 and 152 guide shaft 126 along the Z axis. Shaft 126 is raised and lowered using a motor attached to drive chain 142. Drive chain 142 is a loop that travels around sprocket 156 and sprocket 157. One end of chain 142 is attached to shaft 126 at point 162. The other end of chain 142 is attached to a counterweight 160, which is approximately equal to the weight of hand 112, shaft 114, arm 118, arm 122 and shaft 126. When the chain rotates either: (1) the shaft rises and the counterweight descends, or (2) the shaft descends and the counterweight rises.

FIG. 6 is a close up side view of the bottom of FIG. 5, showing a motor 138 which drives belt drive assembly 140.

Belt drive assembly 140 drives worm gear assembly 168. Worm gear assembly 168 drives shaft 170 which drives the clutch 144 and associated lower chain sprocket 157. Clutch assembly 144 is a standard overriding clutch known in the art. For example, the preferred embodiment clutch assembly is model RC-101410-FS purchased from the Torrington Company, Torrington, Conn.

In operation, arm 122 can be rotated about an axis defined by shaft 126. Arm 118 can be rotated about an axis defined by joint 124, and hand 112 can be rotated about an axis defined by shaft 114. Thus, a clean room operator can push hand 112 causing arm 122 to rotate about shaft 126, arm 118 to rotate about joint 124, or hand 112 to rotate about shaft 114, or a combination thereof.

Shaft 126 can be raised or lowered using the motor 138. Hand 112 includes two buttons, 113A and 113B (FIG. 4). By pushing button 113A, shaft 126 is lowered by motor 138. By pushing button 113B, shaft 126 is raised by motor 138. Hand 112 has a container engagement switch 214 (FIG. 7) that is activated by container 18 pushing against switch 214 when container 18 is fully engaged by hand 112. If switch 214 is activated, motor 138 will raise shaft 126 when the operator pushes button 113B. If switch 214 is not activated, motor 138 will not raise shaft 126 when button 113B is depressed. This safety feature prevents hand 112 from being raised when container 18 is not fully engaged by hand 112 causing the container to be dropped and the wafers to be damaged. However, due to the design of the chain and counterweight, shaft 126 can be manually lifted. For example, without pushing button 113B, an operator can push up on hand 112, which causes shaft 126 to be raised without the use of motor 138. Pushing down on hand 112 will not cause shaft 126 to be lowered. Lowering of the shaft 126 must be done with motor 138. Therefore, buttons 113A and 113B, and pushing/pulling hand 112 provides hand 112 with a large range of motion in the X, Y, and Z directions.

Figure 7:
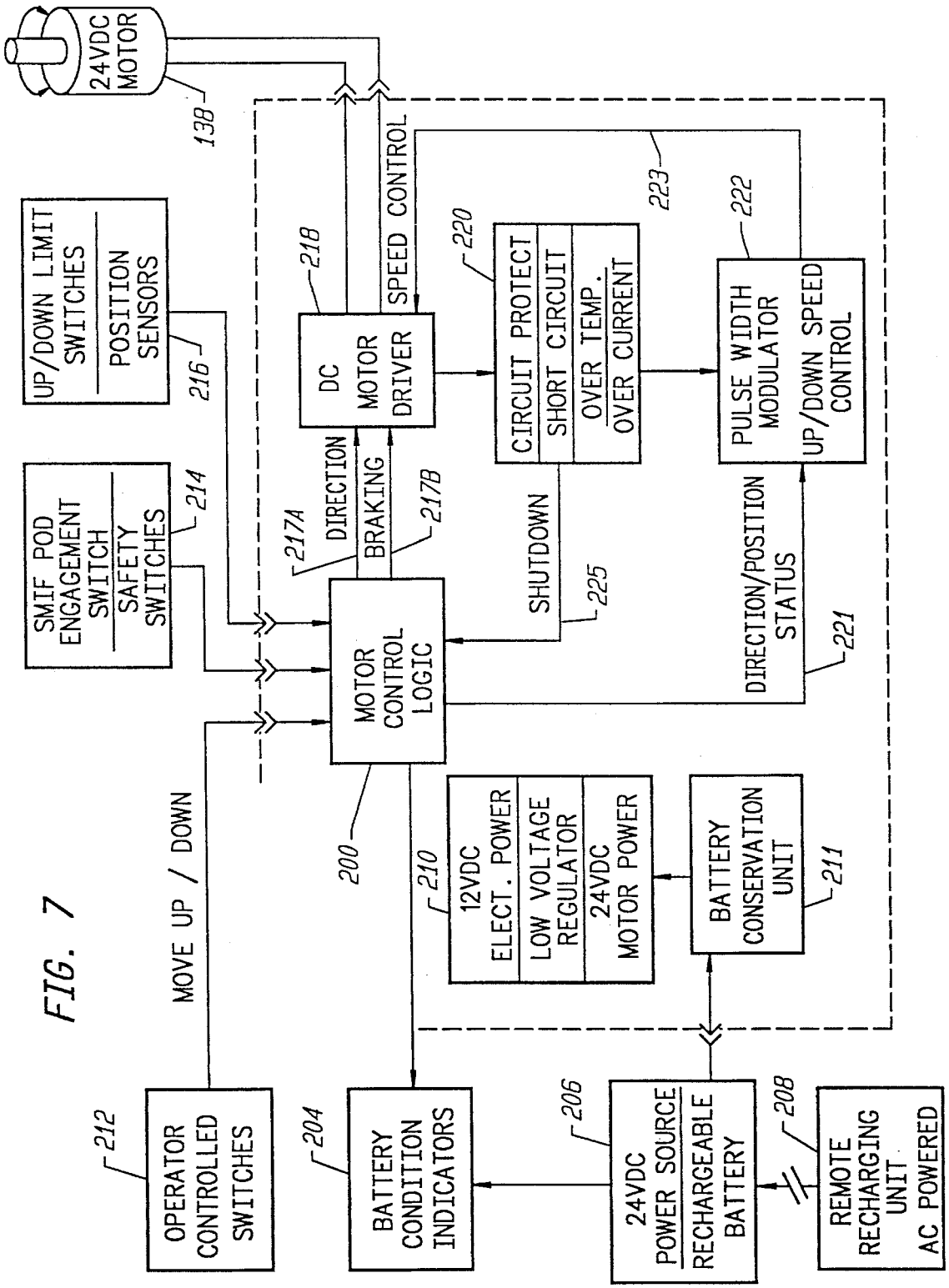
FIG. 7 is a block diagram of the electronics of the present invention.

FIG. 7 shows the block diagram of the electronics for the mobile loader stocker. The focus of the electronics is motor control logic 200, which can be a microprocessor or hardwired logic. The electronics are powered by a 24 V power source 206, which is a rechargeable battery. Battery condition indicators 204, controlled by motor control logic 200, let the operator know the current state of the battery (e.g. charged or needs to be recharged). When battery 206 needs to be recharged, it is removed from cart 130 and replaced by a charged battery. The uncharged battery is then brought to a remote charging unit 208 which is A/C powered for recharging the battery. Connected to power voltage regulator 210 and power source 206 is a power conservation unit 211. When the clean room operator has not pushed buttons 113A or 113B for more than 5 seconds, power is turned off to the motor and the majority of the electronic circuitry. As soon as one of the buttons 113A or 113B is pushed, power is restored. This feature allows the life of the battery to be extended between recharges.

Motor control logic 200 determines whether to raise or lower shaft 126 based on operator controlled switches 212, which include buttons 113A and 113B, described above. Additionally, container engagement switch 214, as described above, is used to prevent the motor from raising shaft 126 when hand 112 is not engaging box 20. Position sensors 216 are used to prevent the motor 138 from raising shaft 126 past the upper allowable limit for vertical motion or lowering shaft 126 below the bottom limit for vertical motion. Motor control logic sends two signals to a D/C motor driver 218. The first signal, direction 217A, communicates to the motor driver 218 which direction to move the shaft 126. Breaking signal 217B communicates to the motor driver 218 when to stop motor 138 and prevent shaft 126 from moving. Driver 218 controls current to the motor 138 and direction.

Motor control logic 200 also sends directions/position status signal 221 to Pulse Width Modulator 222, which controls the speed of motor 138. Pulse Width Modulator 222 sends speed control signal 223 to driver 218 to communicate the proper motor speed. Protection circuit 220 helps protect against short circuits, over temperature, and over currents. When a hazard is detected, a shutdown signal 225 is sent to motor control logic 200.

Figure 8:
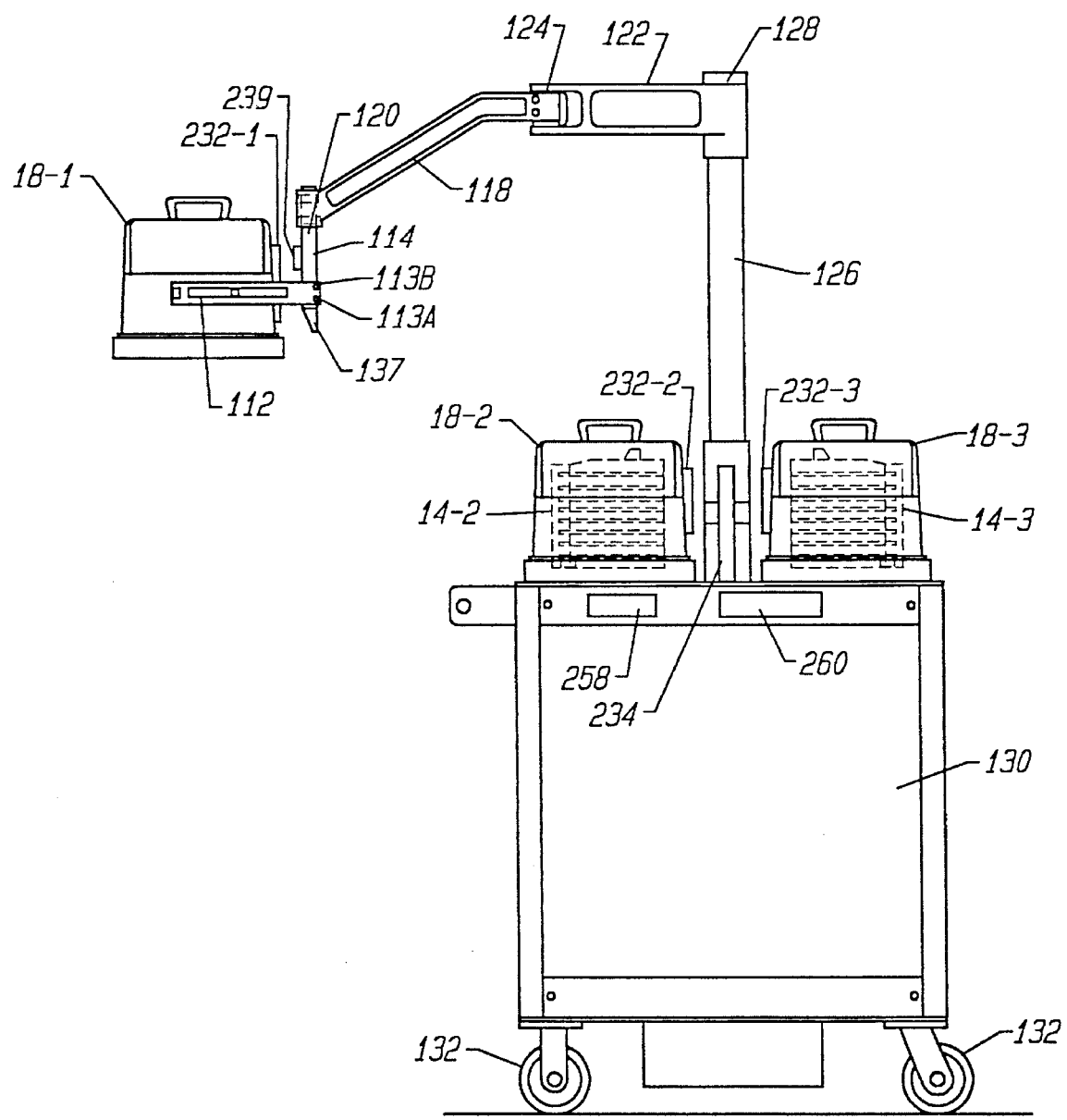
FIG. 8 is a side view of the mobile loader stocker, storing two SMIF pods and engaging one SMIF pod.

FIG. 8 shows a side view of mobile loader stocker 110 engaging one container 18-1 and storing two other containers 18-2 and 18-3. The shaft 126 is in a raised position as compared to FIG. 4. Inside container 18-2 is cassette 14-2. Inside container 18-3 is a cassette 14-3. A clean room operator can manipulate the position of container 18-1 by pushing buttons 113A and 113B to raise and lower container 18-1 in the Z direction and by pushing and pulling on hand 112 to move container 18-1 in the X- and Y direction. Additionally, cart 130 can be pushed to different locations in the clean room.

Figure 9:
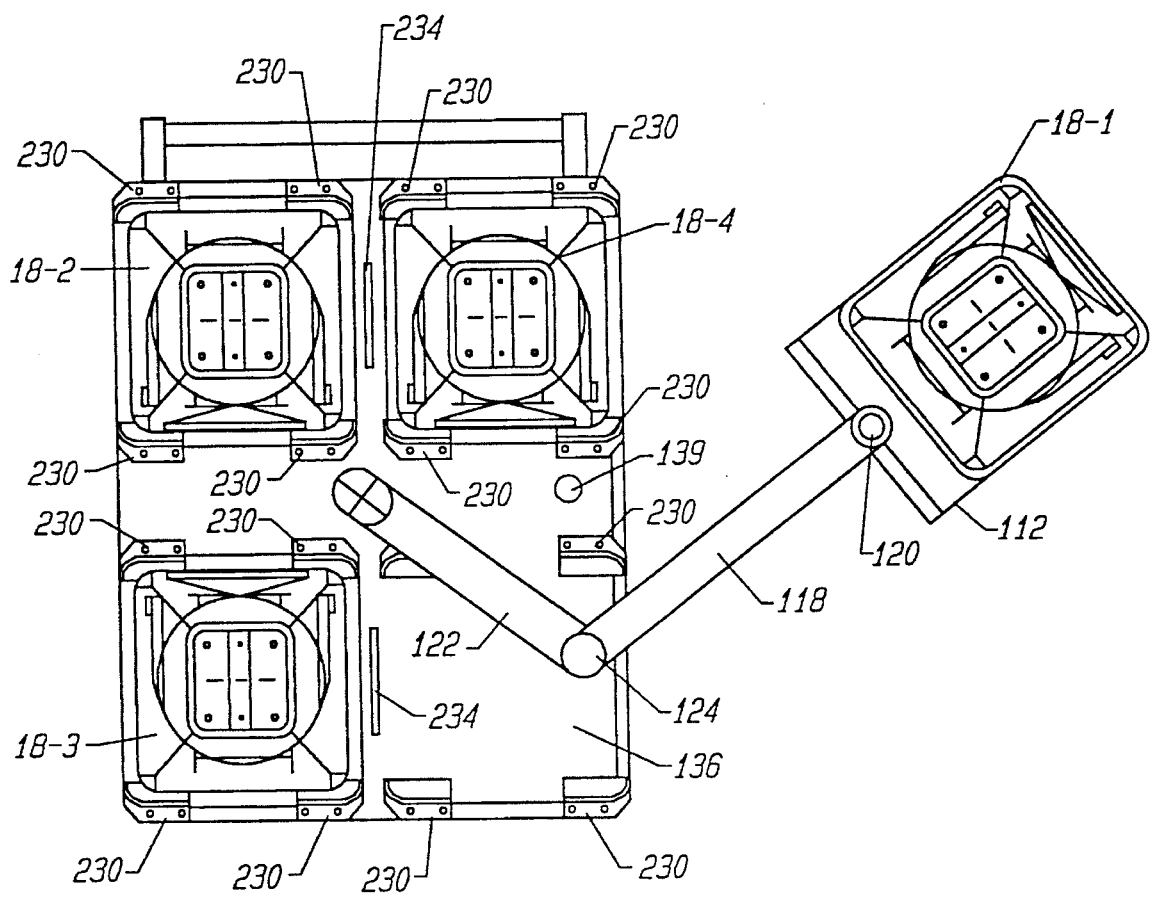
FIG. 9 is a top view of the present invention.

FIG. 9 is a bird's eye view of the mobile loader stocker 110. With this view, container guides 230 are shown mounted on surface 136 and, it can be seen how surface 136 can support four containers. Container guides 230 are used to position containers on surface 136.

Figure 10:
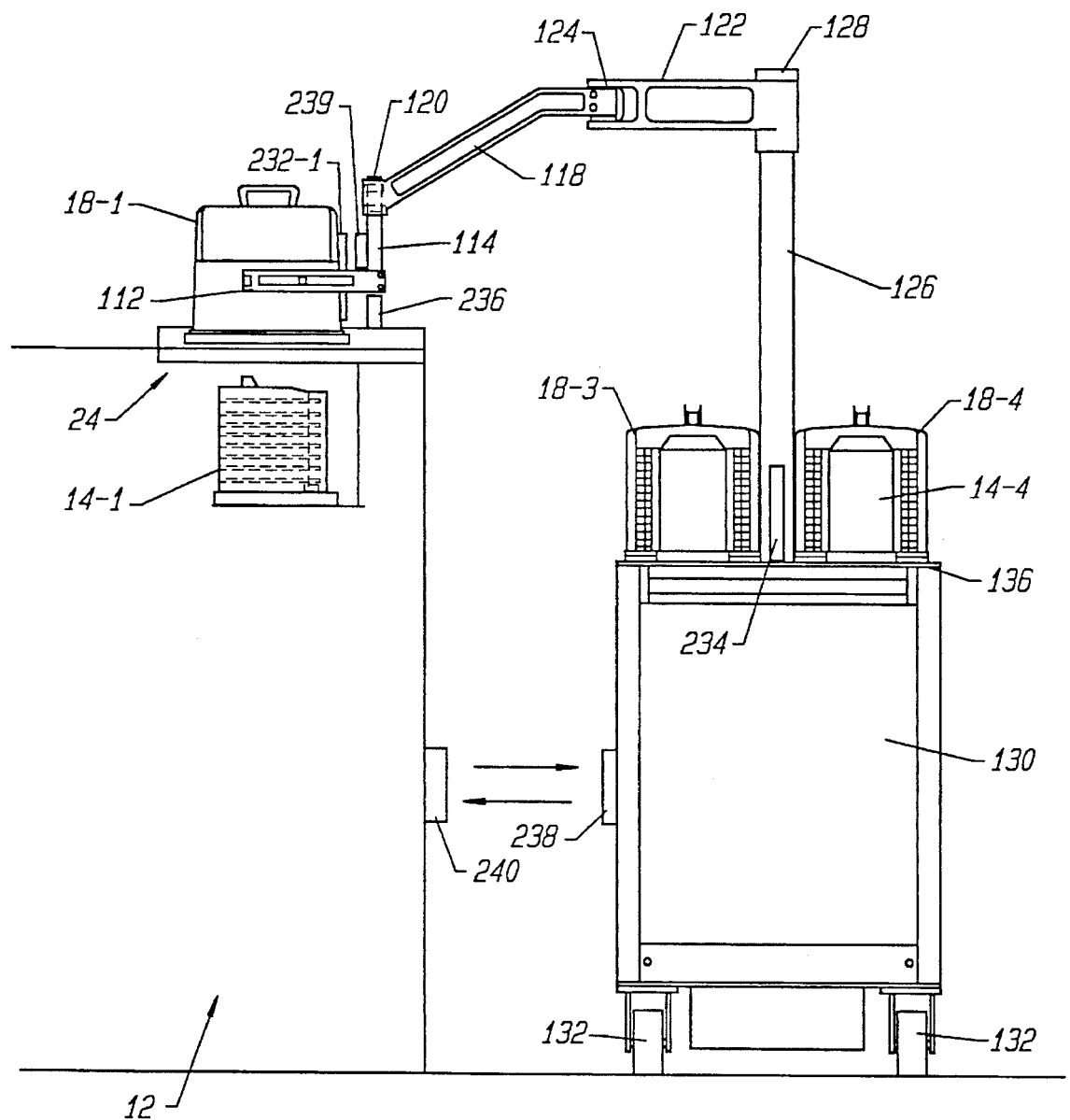
FIG. 10 is a front view of the present invention showing the mobile loader stocker engaging a SMIF pod mated to a port.

FIG. 10 shows the mobile loader stocker 110 engaging container 18-1, which is mated to port 24 of processing station 12. FIGS. 8 and 10 show container 18-1 with an intelligent data card 232-1 mounted on its side. Port 24 of processing station 12 includes means 236 for communicating with data card 232-1. A more detailed description of data card 232-1 and the communications means 236 are found in U.S. Pat. Nos. 5,097,421; 4,974,166; and 5,166,884; which are incorporated by reference. The means 236 for communicating with data card 232-1 is connected to a data processor (not shown) in the processing station 12. The data processor on the processing station may include a keyboard for the operator to enter instructions. The communicating means 236 includes a photosensitive transistor (not shown) or other photodetector which responds to data transmitted by light emitting diodes (not shown) or other communication means.

Data card 232-1 includes, at least a memory element, for example, a RAM, ROM, EEPROM or any other memory device known in the art. The preferred embodiment of data card 232-1 includes a microprocessor and supporting hardware. Furthermore, the preferred data card 232-1 includes a communication means similar to communication means 236 for communicating with communication means 236. When container 18-1 is properly seated on port 24, card 232-1 can communicate via communication means 236 to the processor in processing tool 12.

When container 18-1 is on the mobile loader stocker 110, the intelligent data card 232-1 can communicate with a container tracking unit 248 on mobile loader stocker 110 via communication means 234 found on cart 130. FIG. 10 shows containers 18-2 and 18-3 seated on surface 136 of mobile loader stocker 110. Container 18-2 includes intelligent card 232-2 which communicates with communication means 234. Communication means 234 communicates with the container tracking unit 248. Additionally, intelligent data card 232-1 can communicate with container tracking unit 248 via hand communication unit 239 found on shaft 114.

Figure 11:
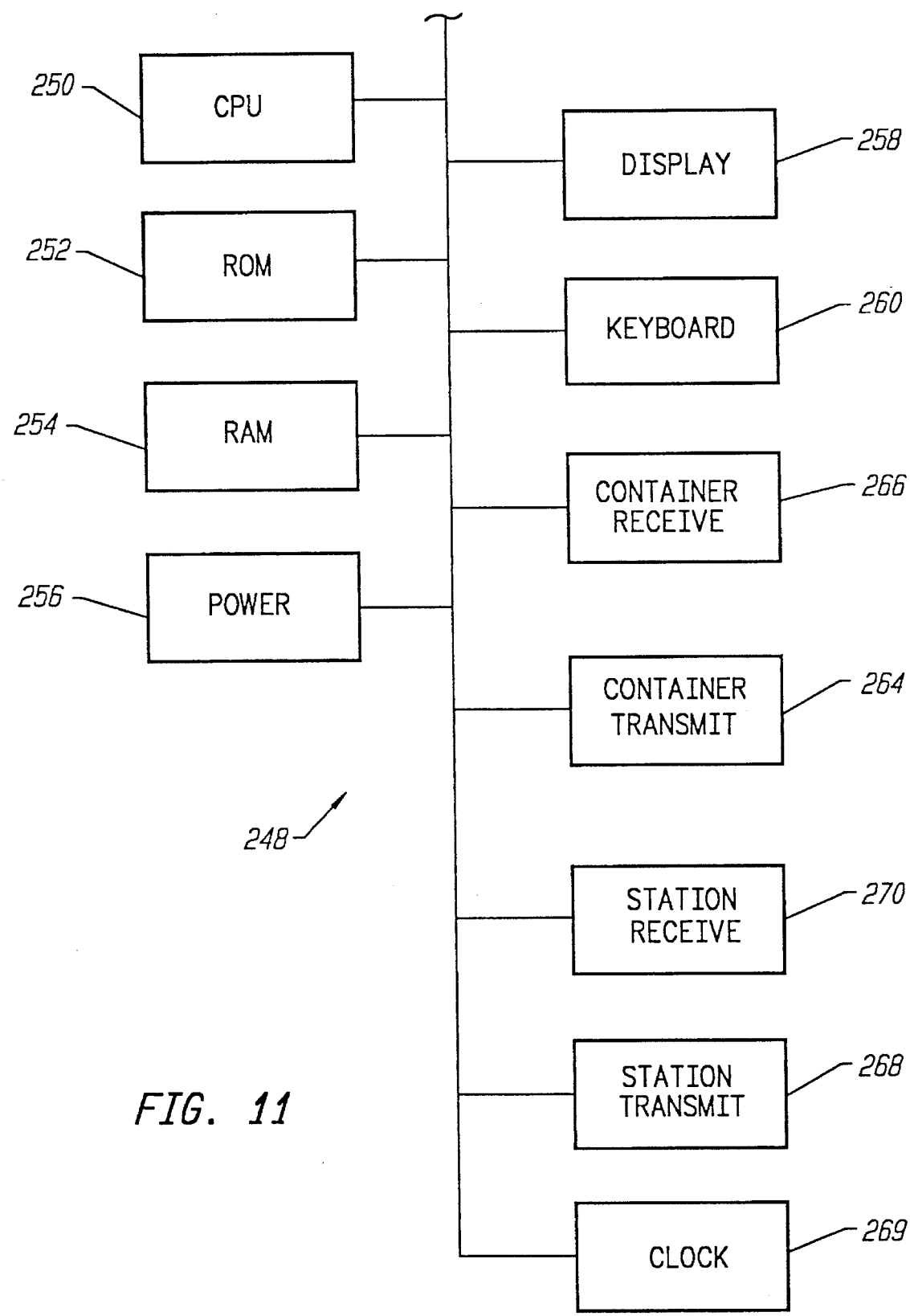
FIG. 11 is a block diagram of an electronic pod tracker located on the mobile loader stocker.

FIG. 11 is a block diagram of container tracking unit 248 on the mobile loader stocker 110. The tracking unit 248 includes a CPU or microprocessor 250 and ROM 252 which holds firmware used to program CPU 250. RAM 254 is used to store data about containers and processing equipment, as well as guidance data, to be discussed below. Power 256 can be provided by a conventional battery. A display 258 is included which could be an LED, LCD or other display known in the art. A keyboard 260 is used to allow the operator to enter commands. Display 258 and keyboard 260 are also shown in FIG. 8. The mobile loader stocker 110 includes two transmitting units and two receiving units. Container transmitter 264 and container receiver 266, which include communication means 234 and hand communication unit 239, are used to communicate with data card 232-1. Station transmitter 268 and station receiver 270, housed in communication means 238 (FIG. 10), are used to communicate with the processing station (e.g. communication means 240).

In operation, there are various alternatives for using the cards, processors, and communication means described in the preceding paragraphs. In one alternative, the system can be used for inventory control. For example, when a clean room operator wheels the mobile loader stocker 110 to a processor station 12, the container tracking unit 248 can query the processor on the processing station 12 via communication means 238 and 240 to determine whether one of the four containers on the surface 136 of the mobile stocker loader 110 ought to be loaded onto the port 24 of station 12. Display 258 can then tell the operator which container, if any, to place on port 24. In one alternative, cart 130 can contain locks which latch the containers onto surface 136. The latch would only unlatch the correct container for loading on the port. It is also contemplated that, if an operator is confused, the operator can push the mobile loader stocker 110 adjacent to processing station 12 and query the station about whether any of the containers are to be loaded onto that station.

When the container 18-1 is loaded onto port 24, card 232-1 can query the processor on the processing station 12 via the communication means 236 to ensure that the correct container was loaded. When a container is unloaded from the port 24, the processor on the processing station 12 can load to card 232-1 information about the processing done to the wafers and what steps need to be done next. When the container 18-1 is then loaded onto the mobile loader stocker 110, card 232-1 can communicate this information to the CPU 250 on mobile loader stocker 110. Display 258 can then communicate to the operator where to transport the mobile loader stocker 110. Alternatively, the information can be sent directly from the processing tool to CPU 250 via communication means 238 and 240. Alternatives for the various communication means are radio frequency, infrared, and other communication means known in the art.

One alternative includes a bar code on the side of processing station 12 including an identification number of the processing station. Communication means 238 can read the identification number from the bar code to determine, according to a manufacturing software program, whether the processing station is the correct station for container 18-1. It is envisioned that, in an alternative embodiment, communication means 238 could be a wand or light pen.

In another alternative, the container tracking system 248 can communicate with the elevator assembly 30 and/or manipulator assembly 44 via communication means 238 and 240. Or, the clean room operator can communicate with the elevator assembly 30 and/or manipulator assembly 44 via communication means 238 and 240. This feature can be used by the clean room operator to signal to the processing station 12 to start processing the materials inside container 18-1; to convey special instructions or any other information necessary for processing the contents of container 18-1.

The processors and communication means described above could also be used as part of a guidance system to guide the container 18-1 to port 24. In one embodiment, the mobile loader stocker 110 would be moved to a predetermined point marked on the floor of the clean room. At that point, communication means 238 can read from communication means 240 coordinates for X, Y, and Z positions of the port 24. Alternatively, ROM 252 could include the X, Y, and Z coordinates of each port for every processing station in a given clean room. In the latter case, communication means 238 could simply read an identification number for the station (e.g. bar code) and, the processor 250 would read the coordinates from ROM 252 for that particular identification number. Other alternatives include sensors on top of the port 24 which sense the position of container 18-1 and send positioning information via communication means 240 and 238 to processor 250. In the above examples, the X, Y and Z coordinates are used to display position guidance instructions to the clean room operator.

Figure 12A:
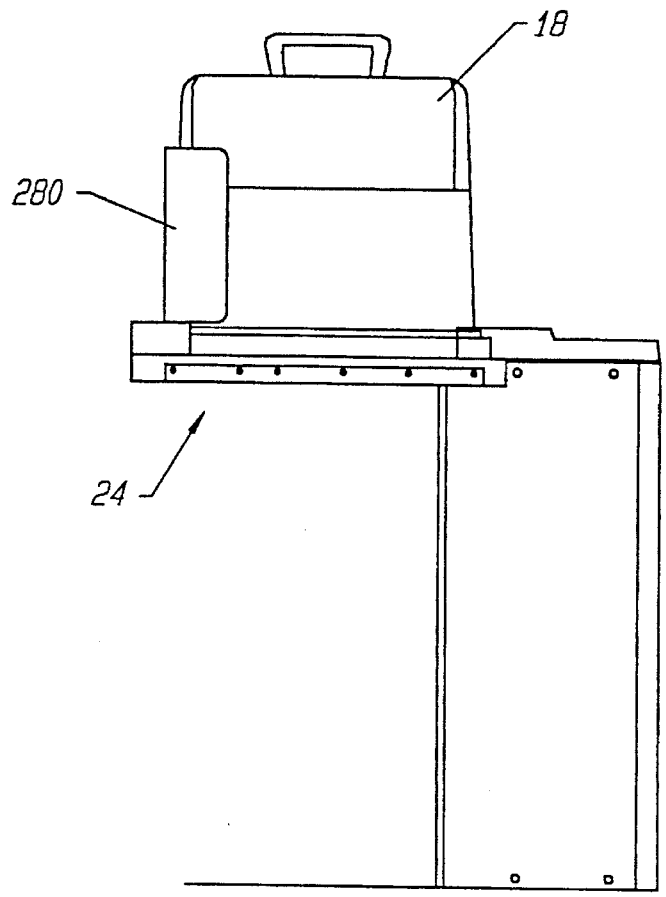
FIG. 12A is a close-up view of the port showing a port plate guide.
Figure 12B:
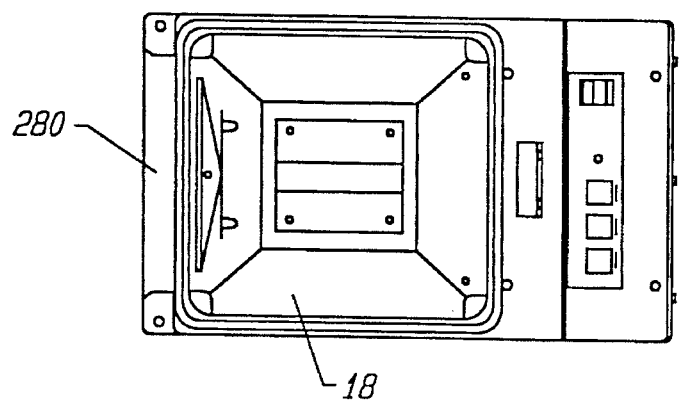
FIG. 12B is a bird's eye view of the apparatus of FIG. 12A.

In another alternative, instead of using X, Y, and Z coordinates, the mobile loader stocker could read a Z coordinate (either from a processor on station 12 or a bar code via communication means 238) and automatically raise the container to the correct level, which is preferably 3 inches above the port. Then, it would be up to the clean room operator to position container 18-1 at the correct X and Y coordinates. FIG. 12A is a side view of port 24 having a port plate guide 280, which assists the clean room operator in positioning container 18 over the port 24. The clean room operator can simply push container 18 up against the port plate guide 280 and then lower container 18. FIG. 12B is a bird's eye view of FIG. 12A.

Figure 13:
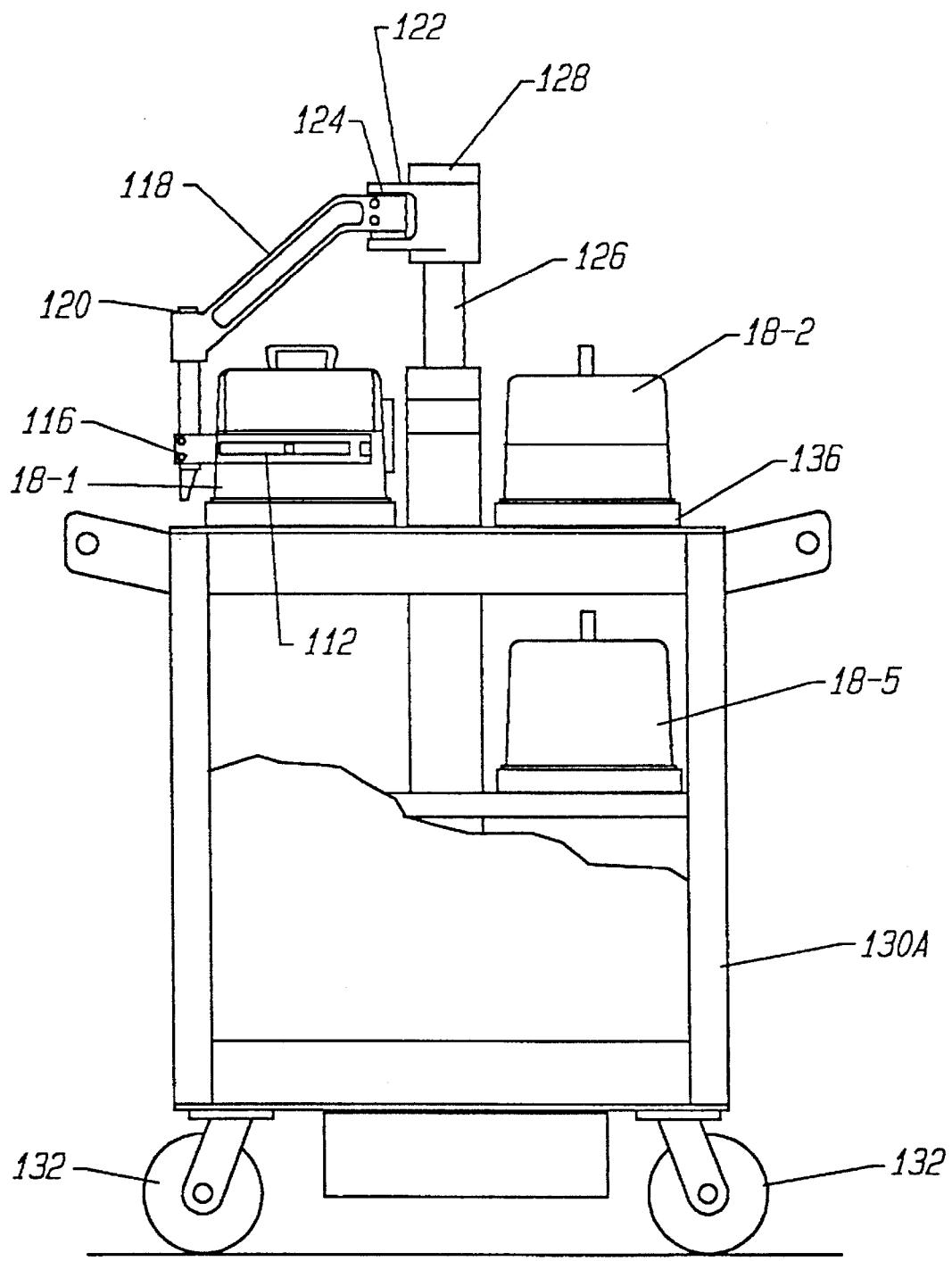
FIG. 13 is an alternative embodiment which can store SMIF pods inside the mobile loader stocker.

Another alternative for the mobile stocker loader is to include storage inside cart 130A. FIG. 13 is a partial cut-away view of the mobile loader stocker 110 showing two containers 18-1 and 18-2 on top of surface 136 and another container 18-5 inside cart 130A. It is anticipated that cart 130A can hold up to eight containers inside the cart. Cart 130A would include a door so that the operator could access the containers stored in the cart.

Figure 14:
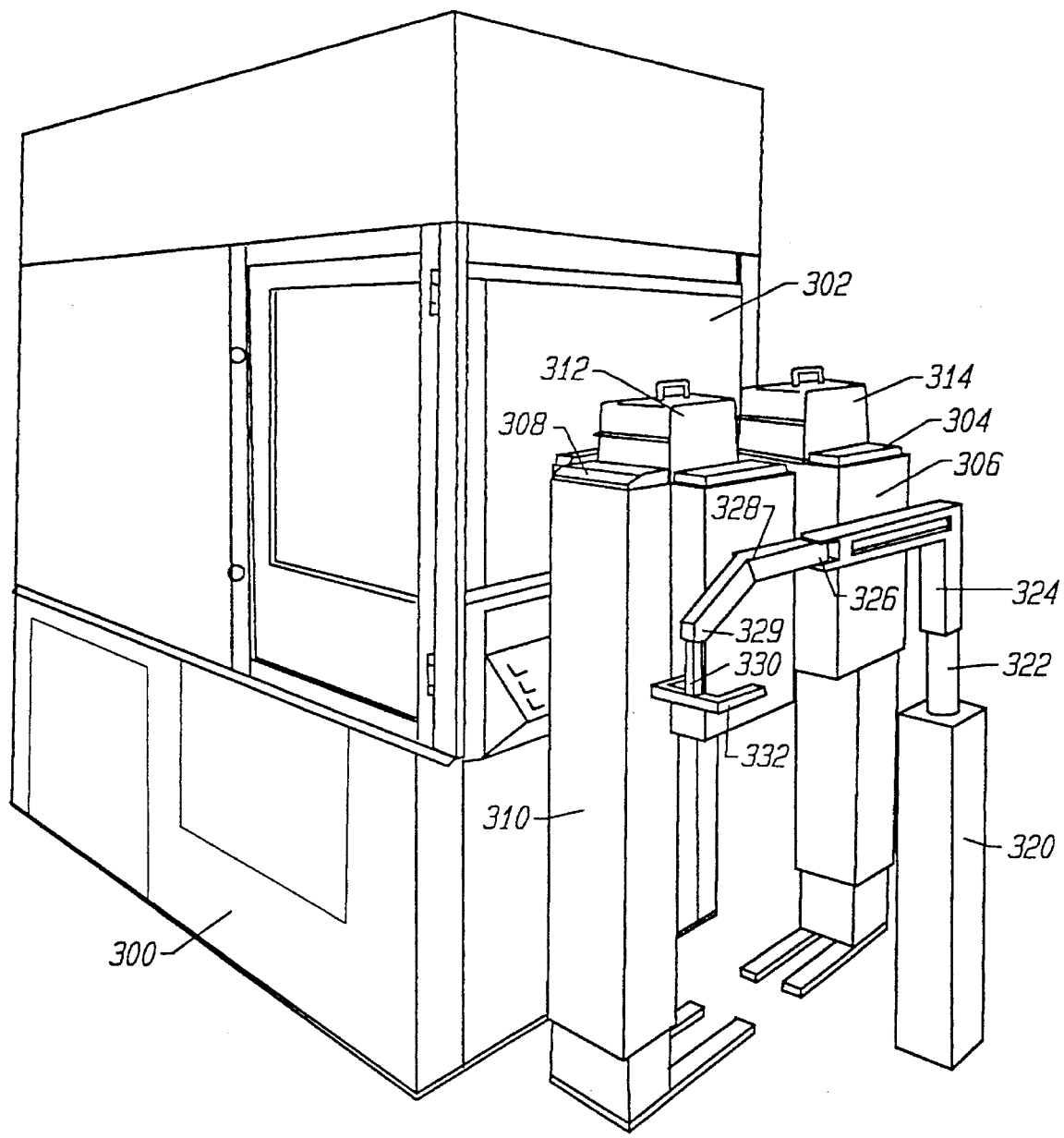
FIG. 14 is an alternative embodiment constructed as part of the SMIF port/enclosure apparatus.

FIG. 14 shows an alternative loader stocker used as part of a processing station 300 having a canopy 302. The processing station further includes two ports. A first port 304 has an elevator mechanism 306 for lowering objects out of container 314. A second port 308 includes an elevator mechanism 310 for lowering objects out of container 312. The loader stocker comprises a stationary base 320 from which a shaft 322 protrudes. Shaft 322 can be raised and lowered, similarly to shaft 126 in FIG. 4. Connected to shaft 322 by a bearing is L-shaped arm 324 which rotates about an axis defined by shaft 322. Bent arm 328 is attached to arm 324 by joint 326 which allows arm 328 to rotate about an axis defined by joint 326. Shaft 330 is attached to bent arm 328 by joint 329, which allows shaft 330 to rotate. Rigidly attached to shaft 330 is hand 332, which is similar to hand 112.

An operator in a clean room equipped with the loader stocker embodiment of FIG. 14 would have a cart with wheels. On top of the cart would be one or more containers. The cart would be wheeled over to base 320 and, the operator would use hand 332 to engage a container and lift that container onto the port. Since the operator can use buttons to engage the motor, the operator does not have to lift any heavy weights, and there is no carpal tunnel degradation.

Figure 15:
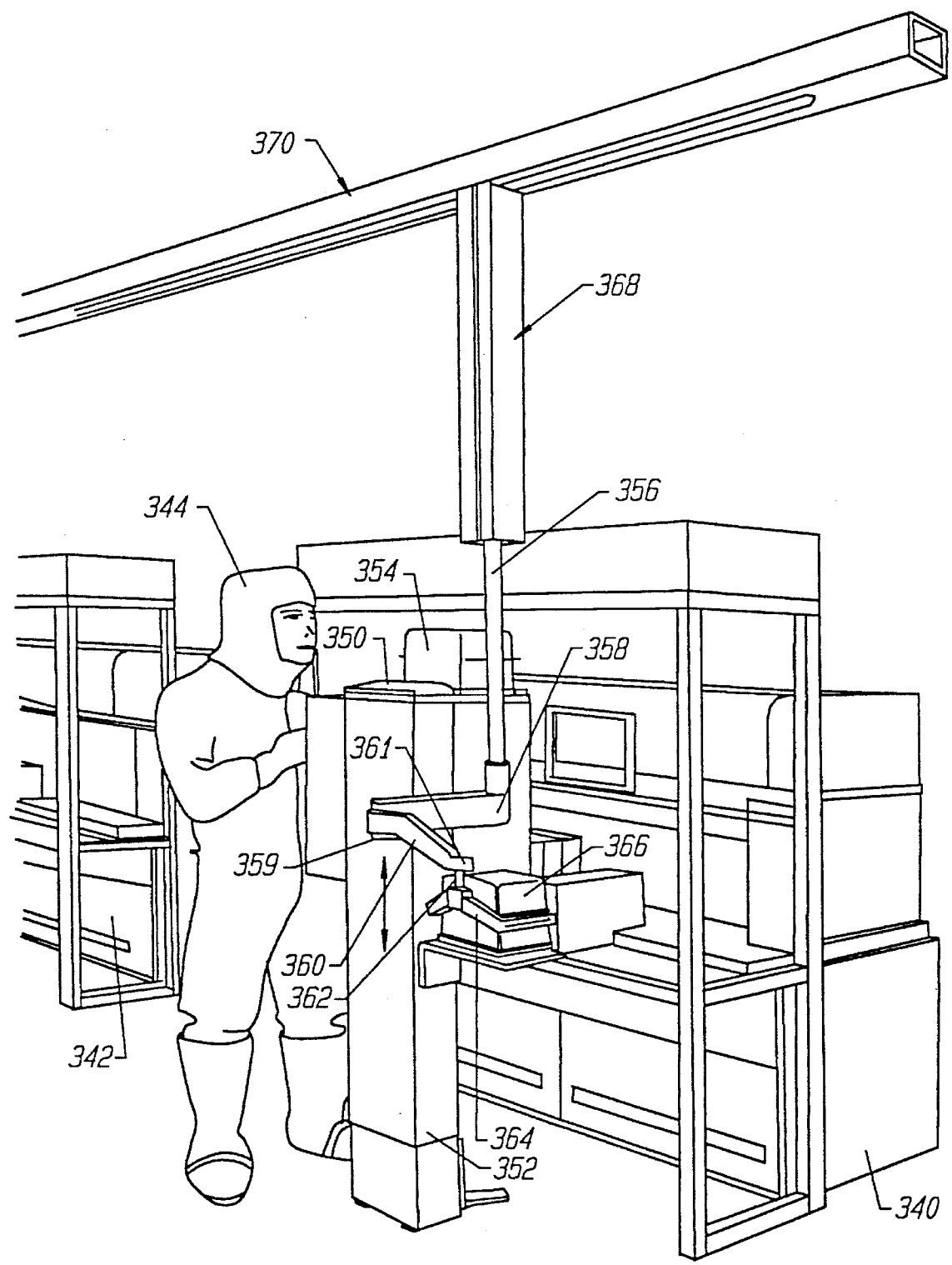
FIG. 15 shows an alternative loader stocker.

FIG. 15 shows another alternative loader stocker used in manufacturing facilities having many processing stations. In FIG. 15, two processing stations, 340 and 342, are depicted. In front of station 340 is a clean room operator 344 interacting with port 350 and elevator assembly 352. Container 354 is mated to port 350. The loader stocker includes a shaft 356 and a first arm 358 attached to shaft 356 by a beating (not shown). First arm 358 can rotate about an axis defined by shaft 356. Second arm 360 is attached to first arm 358 by joint 359. Second arm 360 can rotate about an axis defined by joint 359. Shaft 362 is attached to second arm 358 by joint 361. Shaft 362 can rotate. Attached to shaft 362 is hand 364. FIG. 15 shows hand 364 engaging container 366.

Although the loader stocker of FIG. 15 is not on a cart with wheels, the loader stocker is mobile. Shaft 356 is attached to vertical travel assembly 368. Vertical travel assembly 368, which is similar to support tube 125 (FIGS. 4–6), and the motor, bearings, and gear assembly disclosed in FIGS. 4–6, allows shaft 356 to be moved up and down. Vertical travel assembly 368 is attached to linear travel assembly 370, which allows the loader stocker to be moved to different processing stations.

In operation, the clean room operator can handle container 366 using hand 364. Instead of placing container 366 on a cart, the loader stocker assembly can be moved, with container 366, to processing station 342. The loader stocker of FIG. 15 could be fully automated using the motors, gear assembly, bearings, electronics, intelligent data cards, and communication means described above. One alternative is to use the intelligent data cards and container tracking system described above so that after a container is removed from a port, the operator is notified by a display or monitor where to bring the container. A fully automated system would automatically bring the container to the next processing station after receiving instructions or data from the processing tool which the container was taken from.

Figure 16:
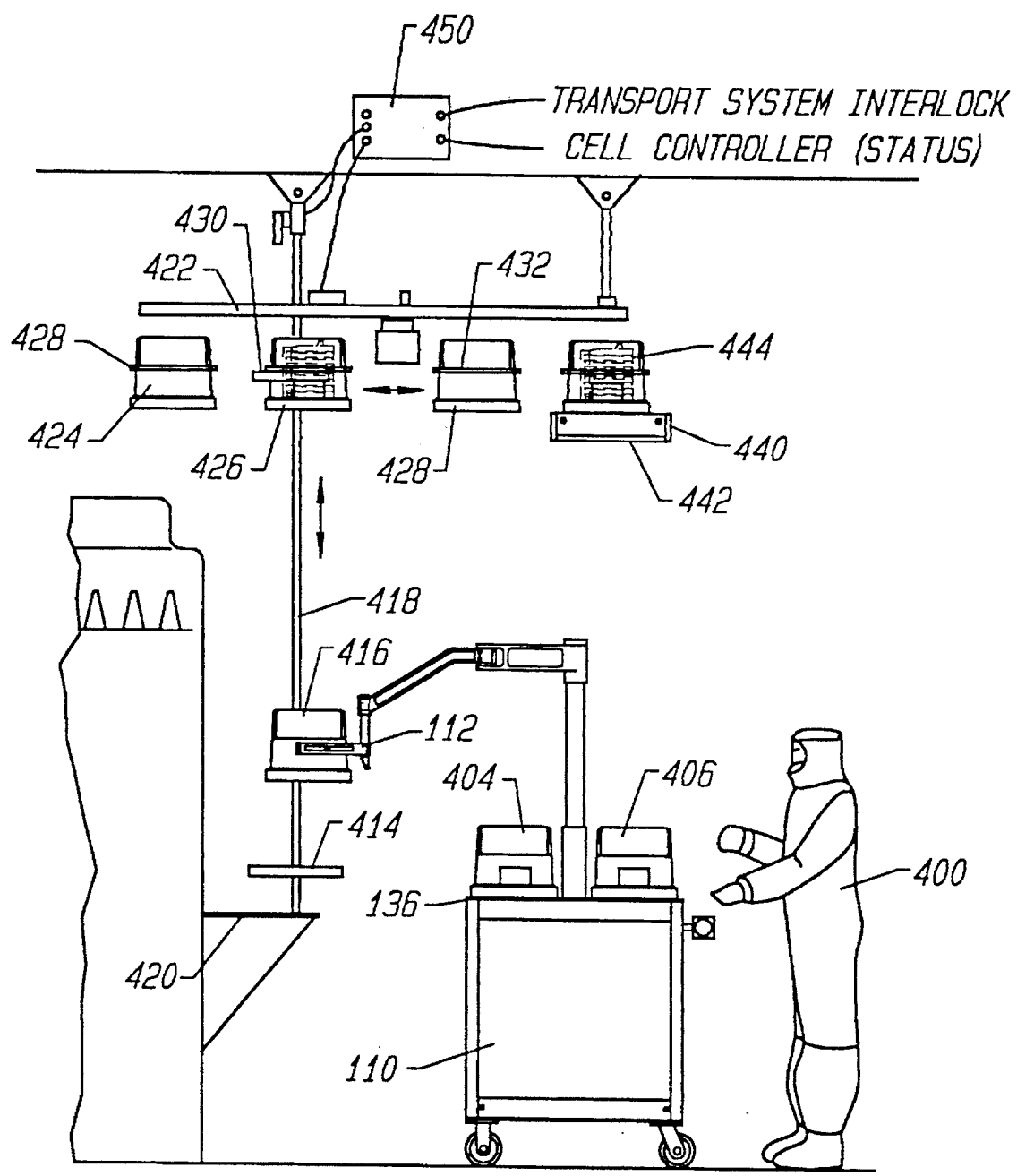
FIG. 16 shows the mobile loader stocker in an overhead transport automation system.

FIG. 16 shows the mobile loader stocker 110 as part of an overhead transport automated system. The mobile loader stocker 110 is being operated by a clean room operator 400. The mobile loader stocker has containers 404 and 406 resting on surface 136 and hand 112 is engaging container 416. Container 416 is in the process of being placed on platform 414 which is part of vertical shuttle 418. Vertical shuttle 418 transfers containers from shelf 420 to horizontal shuttle 422. Horizontal shuttle 422 is shown holding three containers 424, 426, and 428. Each of the containers are being held to the horizontal shuttle by hands 428, 430, and 432. Horizontal shuttle 422 transfers the containers between the vertical shuttle 418 and the material transport system 440. Vertical shuttle 418 and horizontal shuttle 422 could be standard conveyor belts or roller conveyors known in the art. Linear transport 440 includes hands 442 for grabbing container 444. In FIG. 16, linear transport 440 would be coming out of the page. In other words, if the vertical shuttle 418 were the Y-axis and the horizontal shuttle 422 were the X-axis, the linear transport 440 would be the Z-axis. Controller 450, a microprocessor and supporting hardware, is used to control vertical shuttle 418, horizontal shuttle 422, linear transport 440, and can communicate with the container tracking unit 248 on the mobile loader stocker via communication means as described above. This system is used to transport containers or other objects in a manufacturing facility.

Figure 18:
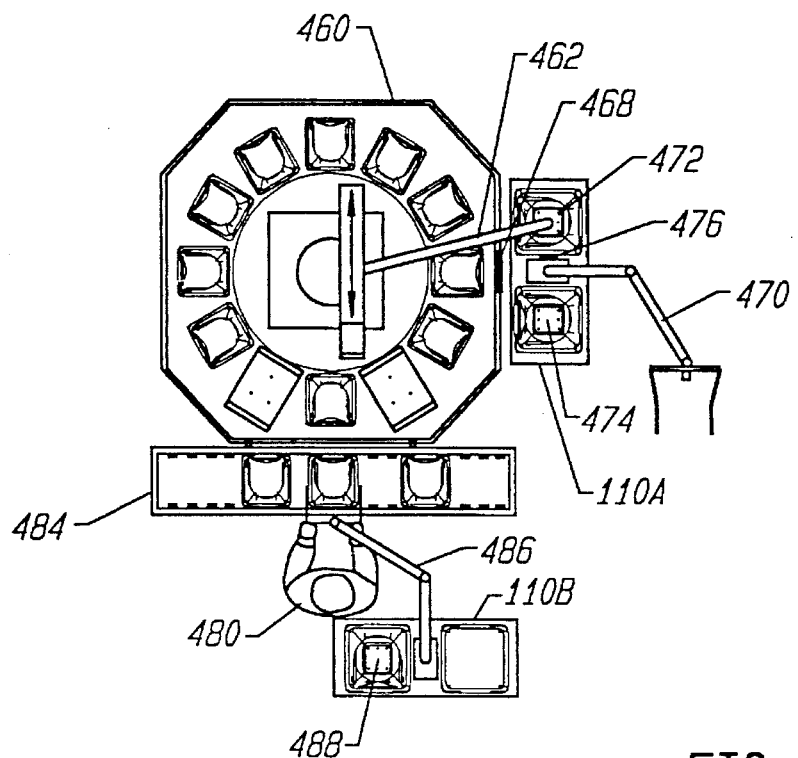
FIGS. 17 and 18 show the mobile loader stocker interfacing with a stationary stocker system.
Figure 17:
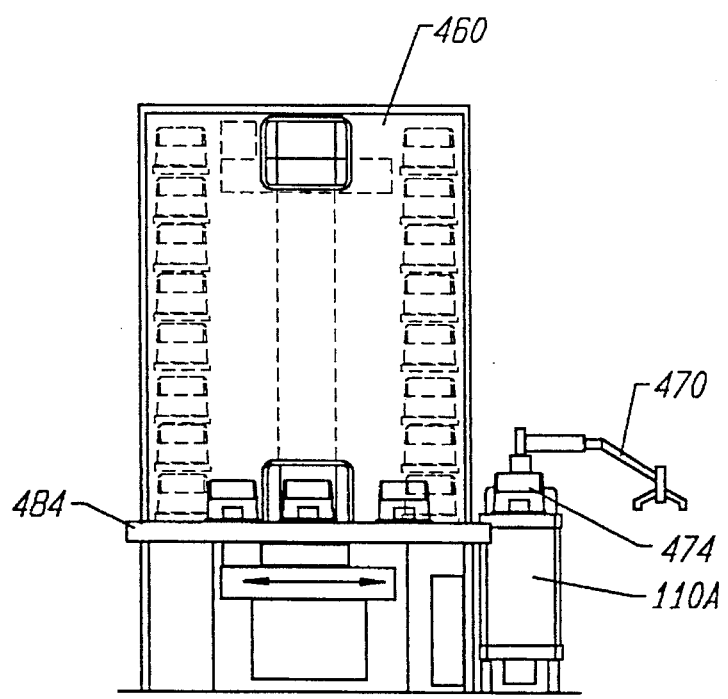

FIGS. 17 and 18 show mobile loader stocker 110A and 110B used as part of a stocking system. The stocker system includes a stationary pod stocker 460 which can stock columns of containers. Containers would be put in the stationary stocker 460 for storage purposes. Stationary stocker 460 has loading arm 462 which is controlled by a microprocessor and automated to load and unload stationary stocker 460. The stationary stocker 460 can be loaded using one of two methods. The first method is an automated loading system. Mobile loader stocker 110A is wheeled up adjacent to the stationary stocker 460 to align with a mechanical position reference 468. Arm assembly 470 of the mobile loader stocker 110A is maneuvered away from the stationary stocker 460. Loading arm 462 of the stationary stocker 460 is programmed to lift containers 472 and 474 from mobile loader stocker 466 and place those containers on the stationary stocker 460. Loader arm 462 includes a communication means that can communicate with intelligent data tag 476 on container 472. Thus, the stationary stocker 460 will have all the information about the work done on container 472 and work that needs to be done. This information is used to maintain an inventory system.

Alternatively, a clean room operator 480 can wheel a mobile loader stocker 482 adjacent to a queuing station 484. The queuing station 484 could be a linear conveyor known in the art. The clean room operator 480 would then manipulate the arm assembly 486 of mobile loader stocker 110B to place container 488 on the queuing station 484. At that point, clean room operator 480 would push a button on a control panel (not shown), causing loading arm 462 to engage container 488 and place container 488 on the stationary stocker 460.

The many features and advantages of the present invention will be apparent to those skilled in the art from the description of the preferred embodiment and the drawings. Accordingly, the following claims are intended to cover all modifications and equivalents falling within the scope of the invention.

What is claimed is:

1. A human guided mobile loader stocker for positioning a load in x, y and z directions of a three dimensional coordinate system, the load having a weight, the apparatus comprising:

first means for engaging the load;

second means for supporting said first means and for allowing said first means to be moved by a first human force in the x–y plane, on and off the x and y axis, without moving in the z direction, said second means including a plurality of members pivotally connected to each other; and third means, selectively engageable, for supporting and moving said second means in the z direction, said third means including a power generator element so that said second means cannot be lowered without engaging said power generator element and said second means can be raised by a second human force less than the weight of the load.

2. A human guided mobile loader stocker for positioning a load according to claim 1, wherein:

said power generator element includes a motor adapted to impart motion to said second means lowering said second means; and said third means further includes a clutch, in cooperation with said motor, adapted to allow said second means to be lowered only when said motor imparts motion to said second means and adapted to allow said second means to rise with said second human force applied to said first means.

3. A human guided mobile loader stocker for positioning a load, the load having a weight, comprising:
   a shaft;
   an arm assembly connected to said shaft and including a plurality of members pivotally connected to each other, said arm assembly adapted to engage the load, said arm assembly adapted to position the load in an x–y plane completely in response to a first human force; and
   a lift including a power generator element, said lift being adapted to lower said shaft substantially along a z axis only in response to said power generator element and being adapted to allow said shaft to rise substantially along said z axis in response to a second human force to said arm assembly less than or equal to the weight of the load.

4. A human guided loader stocker according to claim 3, wherein said power generator element is a motor.

5. A human guided loader stocker according to claim 3, wherein:
   the load is a SMIF container.

6. A human guided loader stocker according to claim 3, further including a safety device adapted to prevent said power generator element from raising said shaft if said arm assembly is not engaging the load.

7. A human guided loader stocker according to claim 3, further including means for moving said stocker.

8. A human guided loader stocker according to claim 3, further comprising:
   a memory element; and
   a receiver, adapted to receive information relevant to the load and communicate information to said memory element.

9. A human guided loader stocker according to claim 3, further comprising a tracking unit, said tracking unit including:
   a communicator, adapted to transmit to and receive information about the load from a source external to the tracking unit;
   a processor, electrically connected to said communicator; and
   a memory element, electrically connected to said processor.

10. A human guided loader stocker according to claim 9, wherein the load includes a transmitter and said communicator receives information from the transmitter.

11. A human guided loader stocker according to claim 9, wherein said tracking unit further includes an input/output apparatus for interacting with an operator.

12. A human guided loader stocker according to claim 9, wherein:
   said memory element is adapted to store a plurality of z coordinates, each z coordinate corresponding to an unloading station;
   said tracking unit includes means for selecting a z coordinate; and
   said processor adapted to communicate control signals to said lift so that the load is positioned at a selected z coordinate.

13. A human guided mobile loader stocker for positioning a load according to claim 3, wherein:
   said arm assembly includes a first member, a second member pivotally connected to the first member and a third member pivotally connected to said second member, said third member adapted to engage the load.

14. A human guided mobile loader stocker for positioning a load according to claim 3, wherein:
   said power generator element is a motor; and
   said lift further includes
      a force transfer mechanism connected to said shaft and adapted to transfer the force to said shaft, and
      a clutch, connected to said motor and adapted to selectively impart the force from the motor to the force transfer mechanism.

15. A human guided mobile loader stocker for positioning a container according to claim 3, further including:
   a counter weight;
   a sprocket;
   a chain, having first, second and third portions, said first portion of said chain engaging said shaft, said second portion of said chain partially wrapped around said sprocket, and said third portion of said chain engaging said counter weight; and
   a clutch assembly selectively engaging said sprocket, said clutch assembly adapted to slip in one direction allowing the sprocket to rotate, causing the chain to move and the shaft to rise with said second human force.

16. A human guided mobile loader stocker for positioning a load, the load having a weight, comprising:
   a base;
   a shaft supported by said base;
   an arm assembly, pivotally connected to said shaft, including a first member and a second member pivotally connected to the first member and a third member pivotally connected to said second member, said third member adapted to engage the load, said arm assembly adapted to be pivoted to position the load in an x–y plane completely in response to a first human force; and
   a lift including:
      a motor, adapted to impart a force,
      a force transfer mechanism connected to said shaft, and
      a clutch, connected to said motor, adapted to selectively impart said force from said motor to said force transfer apparatus so that said force transfer apparatus imparts said force to said shaft causing said shaft to be raised and lowered substantially along a z axis, said lift being adapted to lower said shaft only in response to said motor and being adapted to allow said shaft to rise in response to a second human force.

17. A human guided mobile loader stocker according to claim 16, wherein the force transfer apparatus includes:
   a counter weight;
   a sprocket; and
   a chain, having first, second and third portions, said first portion of said chain engaging said shaft, said second portion of said chain partially wrapped around said sprocket, and said third portion of said chain engaging said counter weight, and said clutch selectively engages said sprocket, said clutch adapted to slip in one direction allowing the sprocket to rotate causing the chain to move and the shaft to rise in response to the second human force to the arm assembly less than the weight of the load.

18. A human guided mobile loader stocker according to claim 16, wherein:
   the load is a SMIF container, said SMIF container includes side rails;
   said third member has two fingers which engage said side rails.

19. A human guided mobile loader stocker according to claim 16, wherein said base includes a top surface adapted to support a container.

20. A human guided mobile loader stocker according to claim 19, wherein:

said top surface includes a notch; and said arm assembly includes a cone adapted to fit in said notch.

21. A human guided loader stocker for positioning a load in x, y and z directions, the load having a weight, the apparatus comprising:

a shaft;

an arm assembly connected to said shaft and including a plurality of members pivotally connected to each other, said arm assembly adapted to engage the load, said arm assembly adapted to position the load in an x–y plane completely in response to a first human force; and a lift including a power generator element, said lift being adapted to lower said arm assembly substantially along a z axis only in response to said power generator element and being adapted to allow said arm assembly to rise substantially along said z axis in response to a second human force to said arm assembly less than or equal to the weight of the load.

* * * * *

UNITED STATES PATENT AND TRADEMARK OFFICE
CERTIFICATE OF CORRECTION

PATENT NO. : 5,570,990
DATED : November 5, 1996
INVENTOR(S) : Bonora, et al.

It is certified that error appears in the above-indentified patent and that said Letters Patent is hereby corrected as shown below:

Title page, line 4 of paragraph [57] ABSTRACT: after "communication" and before "A group" delete "devices." and substitute therefor --means.--.

Col. 11, line 11: after "by a" delete "beating" and substitute therefor --bearing--.

Signed and Sealed this

Sixteenth Day of March, 1999

Attest:

Q. TODD DICKINSON

Attesting Officer

Acting Commissioner of Patents and Trademarks